(12) United States Patent
White et al.

(10) Patent No.: US 7,074,664 B1
(45) Date of Patent: Jul. 11, 2006

(54) DUAL METAL GATE ELECTRODE SEMICONDUCTOR FABRICATION PROCESS AND STRUCTURE THEREOF

(75) Inventors: Ted R. White, Austin, TX (US); Olubunmi O. Adetutu, Austin, TX (US); Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/092,418

(22) Filed: Mar. 29, 2005

(51) Int. Cl.
*H01L 21/8238* (2006.01)
(52) U.S. Cl. ........................................ 438/199; 438/692
(58) Field of Classification Search ................ 438/157, 438/176, 195, 199, 283, 692
See application file for complete search history.

(56) References Cited

U.S. PATENT DOCUMENTS 6,566,181 B1 * 5/2003 Bevk ........................... 438/199

OTHER PUBLICATIONS

Lifshitz, Nadia, et al.; Active Gate Thin-Film Transistor; IEEE Electron Device Letters, vol. 14(8), Aug. 1993.

* cited by examiner

*Primary Examiner*—Hoai Pham

(57) ABSTRACT

A semiconductor fabrication process includes patterning a first gate electrode layer overlying a gate dielectric. A second gate electrode layer is formed overlying the first gate electrode layer and the gate dielectric. Portions of the second gate electrode layer overlying the first gate electrode layer are removed until the first and second gate electrode layers have the same thickness. A third gate electrode layer may be formed overlying the first and second gate electrode layers. The first gate electrode layer may comprise TiN and reside primarily overlying PMOS regions while the second gate electrode layer may comprise TaC or TaSiN and primarily overlie NMOS regions. Removing portions of the second gate electrode layer may include performing a chemical mechanical process (CMP) without masking the second gate electrode layer or forming a resist mask and etching exposed portions of the second gate electrode layer.

7 Claims, 5 Drawing Sheets

DUAL METAL GATE ELECTRODE SEMICONDUCTOR FABRICATION PROCESS AND STRUCTURE THEREOF

FIELD OF THE INVENTION

The present invention is in the field of semiconductor fabrication processes and, more specifically, fabrication processes employing metal gate electrodes.

RELATED ART

Polycrystalline silicon was almost universally preferred as the gate electrode layer in MOS (metal oxide semiconductor) fabrication throughout the 1980's and 1990's. For much of that time, device models largely assumed that the polysilicon gate was saturated with either an n-type impurity such as arsenic or phosphorous or a p-type impurity such as boron. This saturated gate assumption was sufficiently accurate for the transistors of the time, which tended to have relatively thick gate dielectric layers and relatively low electric fields in the gate and the gate dielectric.

With ever advancing scaling, however, the saturated gate assumption is no longer realistic. For example, transistors with very thin dielectrics exhibit electrical characteristics that are influenced by the extent of polysilicon depletion. Polysilicon depletion results in an increase in effective oxide thickness and a decrease in transconductance.

Polysilicon depletion effects are addressed by using a metal instead of polysilicon for the transistor gate electrode. Moreover, the use of dual metal gates (a first metal gate material for NMOS and a second metal gate material for PMOS), in addition to addressing depletion issues, can be effective in matching the threshold voltages of NMOS and PMOS devices. In a conventional dual metal gate process, one type of gate (either NMOS or PMOS) is thicker than the other because one gate has the two different metal gate materials stacked on one another while the other gate only has one of the materials. See, e.g., *Samavedam et al. Dual-Metal Gate CMOS with HfO$_2$ Gate Dielectric*, IEEE International Electron Devices Meeting (IEDM) 2002. The different thicknesses of the gate stacks require different etch times during gate etch processing. The extra etch time needed to etch the thicker gate stack can cause gouging at the base of the gate electrode in other transistors due to a lack of adequate selectivity between the metal gate stack etchants and the gate dielectric that protects the silicon substrate during gate etch. This substrate gouging is believed to have detrimental effects on device behavior.

BRIEF DESCRIPTION OF THE DRAWINGS

The present invention is illustrated by way of example and not limited by the accompanying figures, in which like references indicate similar elements, and in which.

DETAILED DESCRIPTION OF THE DRAWINGS

Generally speaking, the present invention is concerned with dual metal gate fabrication processes in which a first material is used for the gate electrode of PMOS transistors and a second material is used for the gate electrode of NMOS transistors. More specifically, the invention includes dual metal gate processing sequences in which dual metal gates are formed so that the thickness of PMOS transistor gate electrodes is approximately the same as the thickness of NMOS transistor gate electrodes. Achieving gate electrodes of equivalent thickness simplifies the subsequent gate etch because the time required to etch the PMOS transistor gates is substantially the same as the time required to etch the NMOS transistor gates. In addition, having equivalent thicknesses for the PMOS and NMOS transistor gates prevents/minimizes gauging that undesirably affects device behavior.

Figure 1:
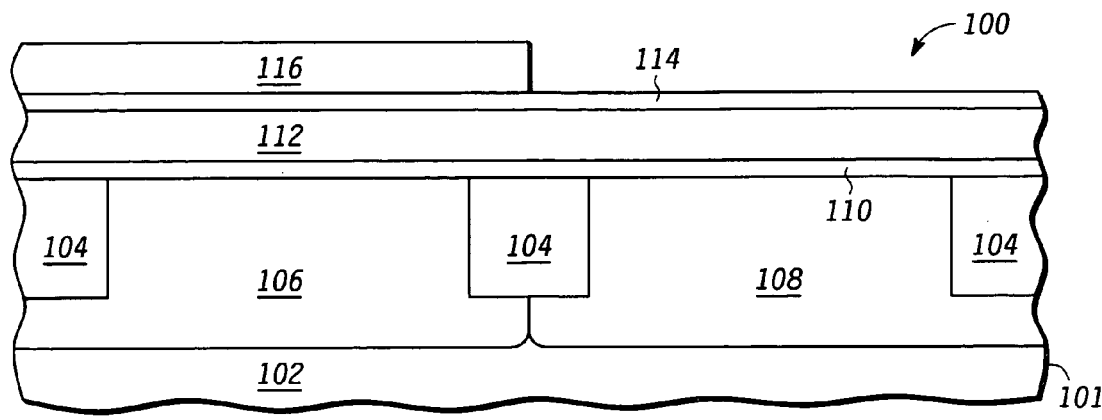
FIG. 1 is a partial cross sectional view of a wafer at an intermediate stage in a semiconductor fabrication process according to one embodiment of the invention in which a first gate electrode layer is formed overlying a gate dielectric, a hard mask is formed overlying the first gate electrode layer, and a photoresist layer has been patterned overlying the hard mask.

Turning now to the drawings, FIG. 1 is a partial cross section of a partially completed integrated circuit 100 being formed on a wafer 101. Wafer 101 includes a semiconductor substrate 102, which is preferably a single crystal silicon substrate. Wafer 101 may be a silicon on insulator (SOI) wafer or a bulk silicon wafer. In the SOI embodiment, wafer 101 includes a buried oxide (BOX) layer and a bulk semiconductor layer (neither of which are depicted) underlying substrate 102.

In the depicted embodiment of wafer 101, substrate 102 includes a first well region (first region) 106 and a second well region (second region) 108. First region 106 is doped with an impurity of a first conductivity type (e.g., n-type or NWELL) while second region 108 is doped with an impurity of the opposite conductivity type (e.g., p-type or PWELL). As such, first region 106 is suitable for forming transistors of a first type (e.g., PMOS) while second region 108 is suitable for forming transistors of the opposite type (e.g., NMOS). Isolation dielectric structures 104 shown in FIG. 1 provide physical and electrical isolation between adjacent active areas of substrate 102 according to well-known techniques.

Wafer 101 as depicted in FIG. 1 includes a gate dielectric 110 overlying substrate 102. Gate dielectric 110 may include a high dielectric constant (high K) dielectric film having an effective oxide thickness of less than approximately 2 nm (20 angstroms). As used in this disclosure, a high K dielectric refers to a dielectric having a dielectric constant of approximately 20 or more. In one embodiment, gate dielectric 110 is a metal oxide compound such as $HfO_2$, a metal nitride compound, or a metal silicate compound. In another embodiment, gate dielectric 110 is an $SiO_2$, SiON, or $Si_3N_4$ gate dielectric. The invention is particularly useful for the silicon-based gate dielectrics, which do not exhibit high etch selectivity to etchants commonly used in metal gate etches.

A first gate electrode layer 112 is formed overlying gate dielectric 110. In one embodiment, first gate electrode layer 112 is selected based upon its resistivity and its work function characteristics. First gate electrode layer 112 preferably has an electrical resistivity of less than approximately 50 $\mu\Omega$-cm and a work function close to the valence band of silicon. For an embodiment in which first region 106 is suited for PMOS transistors fabrication, first gate electrode layer 112 is preferably a conductive oxide, nitride, or oxynitride of Titanium, Molybdenum, Iridium, or Ruthenium (e.g., TiN). An optional hard mask 114 is shown as having been formed overlying first gate electrode 112. In this embodiment, hard mask 114 may be a deposited dielectric film such as a tetraethylorthosilicate (TEOS) film. A photoresist layer 116 overlying hard mask 114 has been patterned to expose portions of hard mask 114 overlying second region 108). In other embodiments (not shown), hard mask 114 is omitted and photoresist layer 116 is formed directly on first gate electrode layer 112.

Figure 2:
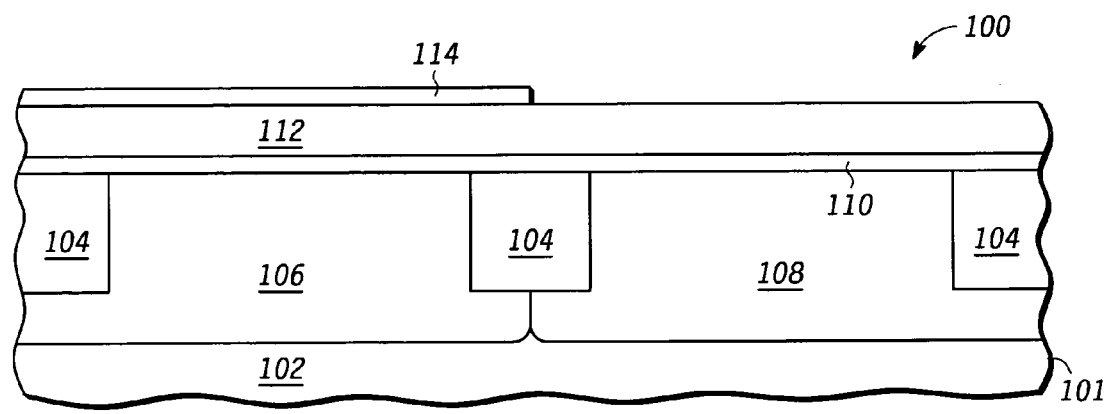
FIG. 2 depicts processing subsequent to FIG. 1 in which the hard mask has been patterned to remove portions of the hard mask overlying one of the well regions.

Turning now to FIG. 2, the exposed portions of hard mask 114 have been etched away and the photoresist layer 116 stripped. Removal of this portion of hard mask 114 exposes underlying portions of first gate electrode layer 112 (i.e., the portions of gate electrode 112 overlying second region 108. The etched hard mask 114 serves as an etch mask for the underlying first gate electrode layer 112.

Figure 3:
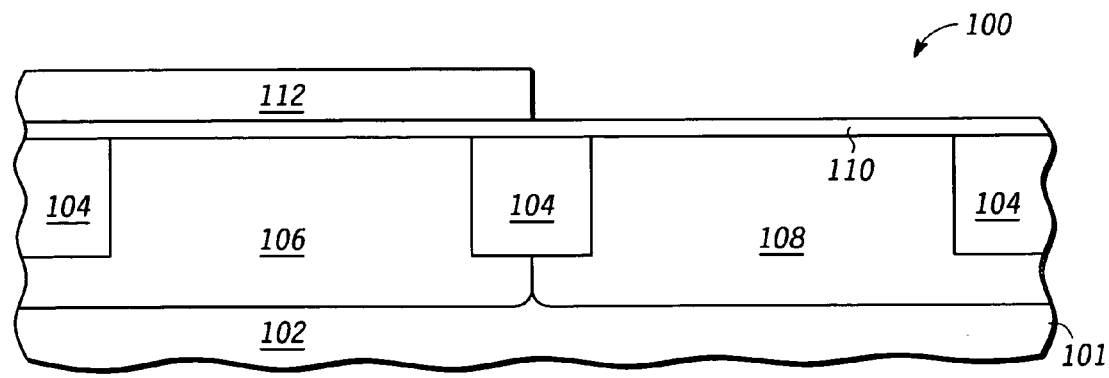
FIG. 3 depicts processing subsequent to FIG. 2 in which portions of the first gate electrode layer exposed by the patterned hard mask is etched.

Turning now to FIG. 3, portions of first gate electrode layer 112 exposed by patterned hard mask 114 have been etched away and the hard mask 114 removed. Alternatively, hard mask 114 can remain to act as a polish stop for the chemical mechanical polish (CMP) process described below. (Because the hard mask 114 may or may not be present following etching of first gate electrode layer 114, hard mask 114 is shown as a dashed lines in FIG. 3 and FIG. 4). The etching of first gate electrode layer 112 exposes portions of gate dielectric 110 overlying second region 108.

The depicted implementation illustrates first gate electrode layer 112 being entirely removed over second region 108. In some embodiments, portions of first gate electrode layer 112 overlying portions of second region 108 may be preserved (not etched). Referring to FIG. 15, for example, first gate electrode layer 112 may be patterned to leave islands 112-1 and 112-2 of first gate electrode layer 112 overlying second region 108. These electrically floating islands may serve as structural tiles or plateaus to make a subsequent chemical mechanical polish (CMP) process more manufacturable by minimizing dishing and erosion. Alternatively, islands 112-1 and/or 112-2 may form passive devices such as semiconductor capacitors or active devices such as transistors. In the latter embodiment, the transistors would exhibit different electrical characteristics than transistors in which the first gate electrode layer 112 overlies first region 106.

Figure 4:
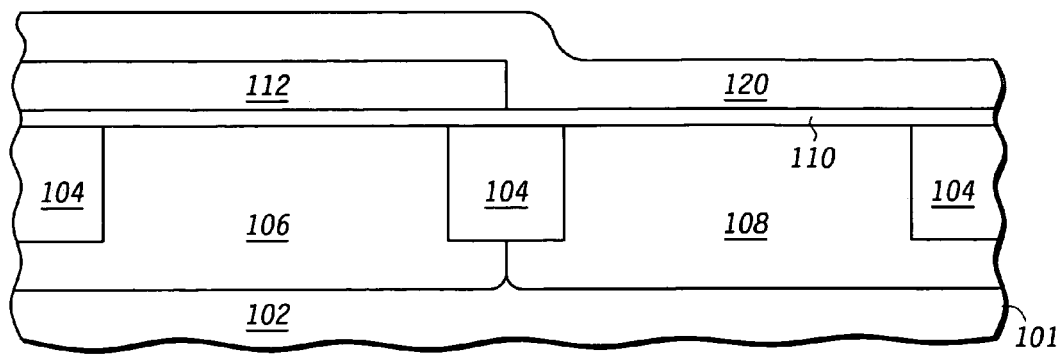
FIG. 4 depicts processing subsequent to FIG. 3 in which a second gate electrode layer is deposited.

Turning now to FIG. 4, a second gate electrode layer 120 is deposited overlying first gate electrode layer 112 and the portion of gate dielectric 110 overlying second region 108 of wafer 101. Second gate electrode layer 120 is preferably a highly conductive material having a conductivity of less than approximately 50 $\mu\Omega$-cm. Suitable materials for NMOS devices preferably have work functions close to the conduction band edge of 4.1 eV. In an embodiment where second region 108 is an NMOS region of wafer 101, second gate electrode layer 120 may be selected from candidates including TaSiN, TaC, and $Ta_xC_yN_z$.

Inspection of FIG. 4 reveals that the thickness of the stack overlying first region 106 is greater than the thickness of the stack overlying second region 108. This gate electrode thickness difference between NMOS and PMOS transistors may lead to gouging of silicon substrate 102 during a subsequent gate etch process. Because chlorine- and fluorine-based etch gases do not exhibit great selectivity with respect gate dielectric 110, the gate etch may break through the thin dielectric under the thinner gate stack while the thicker gate stack is being etched. Once the gate dielectric 110 is removed, continued etching necessary to etch through the thicker gate electrode may gouge the silicon substrate surface. The present invention addresses this problem by proposing processing sequences that produce "same-thickness" gate electrodes in a two metal process.

Figure 5:
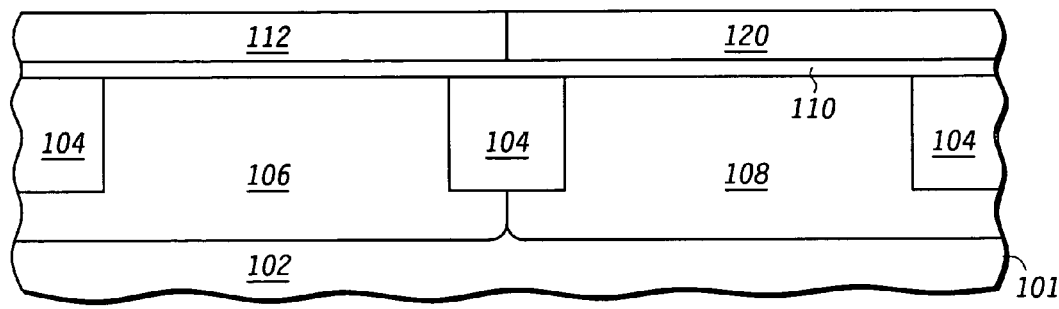
FIG. 5 depicts processing subsequent to FIG. 4 in which the portions of second gate electrode layer have been removed by chemical mechanical polishing.

Referring now to FIG. 5, portions of second gate electrode layer 120 overlying first gate electrode layer 112 are removed. In an embodiment desirable for its sparse use of photolithography equipment (i.e., no masking step required to achieve same-thickness gate electrodes), a chemical mechanical polish (CMP) is performed to eliminate the portions of second gate electrode layer 120 that overlie the first gate electrode layer 112. (If the hard mask 114 remains as in the alternative described in FIG. 3, it can be removed at this point). As depicted in FIG. 5, the CMP process produces a substantially planar upper surface of first and second gate electrode layers 112 and 120 so that the thickness of the gate electrode layer overlying the first region 106 and the gate electrode layer overlying second region 108 is substantially equal.

Figure 6:
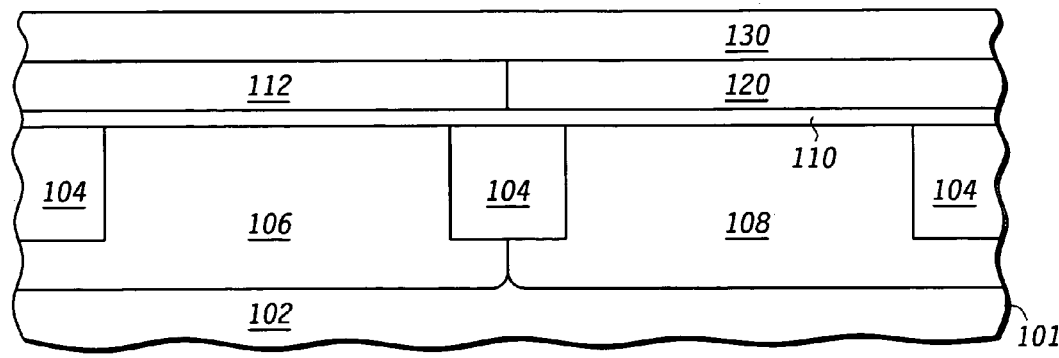
FIG. 6 depicts processing subsequent to FIG. 5 in which a third gate electrode layer is deposited over the first and second gates.

Referring now to FIG. 6, a third gate electrode layer 130 is deposited over the first and second gate electrode layers 112 and 120. In an embodiment in which first gate electrode layer 112 is TiN and the second gate electrode layer 120 is TaSiN or TaC, third gate electrode layer 130 may be conventional polycrystalline silicon (polysilicon). While the use of highly conductive materials adjacent the gate dielectric interface addresses issues caused by polysilicon depletion effects, the use of polysilicon for third gate electrode layer 130 overlying the metal gate electrode layers 112 and 120 simplifies back end processing by incorporating a legacy gate electrode layer into a particular processing sequence.

Figure 7:
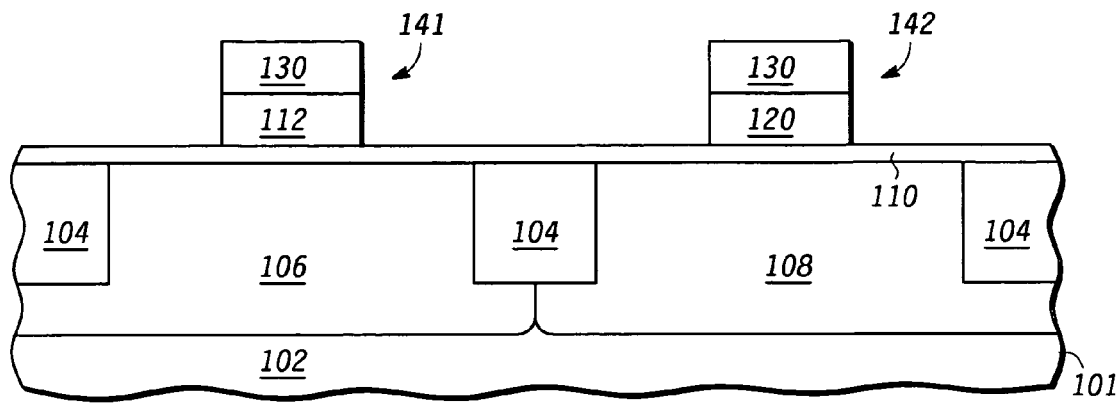
FIG. 7 depicts processing subsequent to FIG. 6 following the formation of gate electrodes overlying the first and second well regions.

Referring now to FIG. 7, the gate stack depicted in FIG. 6 is patterned with gate photolithography and etch processes to form first and second transistor gate electrodes 141 and 142. In the illustrated example, first gate electrode 141 is a PMOS transistor gate electrode and second gate electrode 142 is an NMOS transistor gate electrode. Because the thickness or height of gate electrodes 141 and 142 is approximately equal, the gate etch process requires an approximately equal duration to complete the formation of gate electrodes 141 and 142. In the described implementation, first gate electrode 141 includes a polysilicon upper portion 130 and a lower portion of a metal 112 such as titanium nitride. Second gate electrode 142 includes a polysilicon upper portion 130 and a lower portion 120 of a metal such as tantalum silicon nitride or tantalum carbide.

Figure 8:
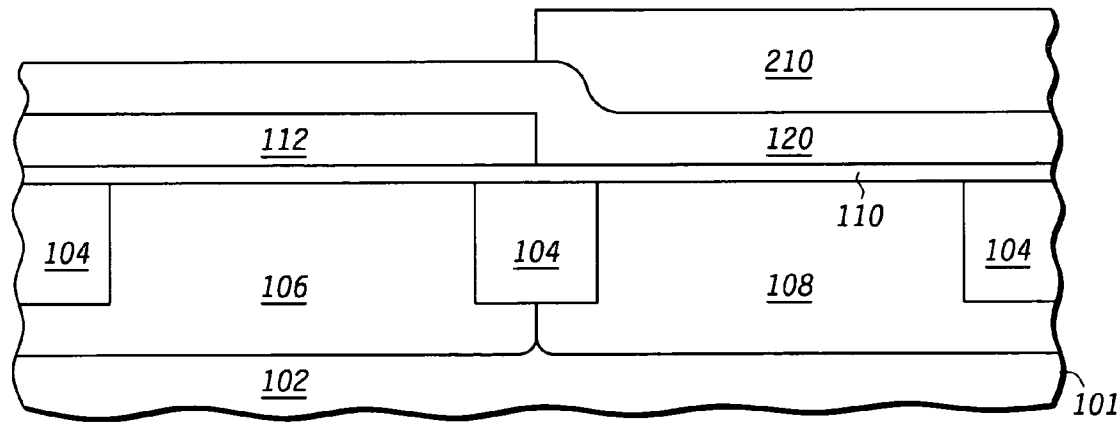
FIG. 8 depicts processing subsequent to FIG. 4 according to a second embodiment in which a resist mask is patterned over the second well region.
Figure 9:
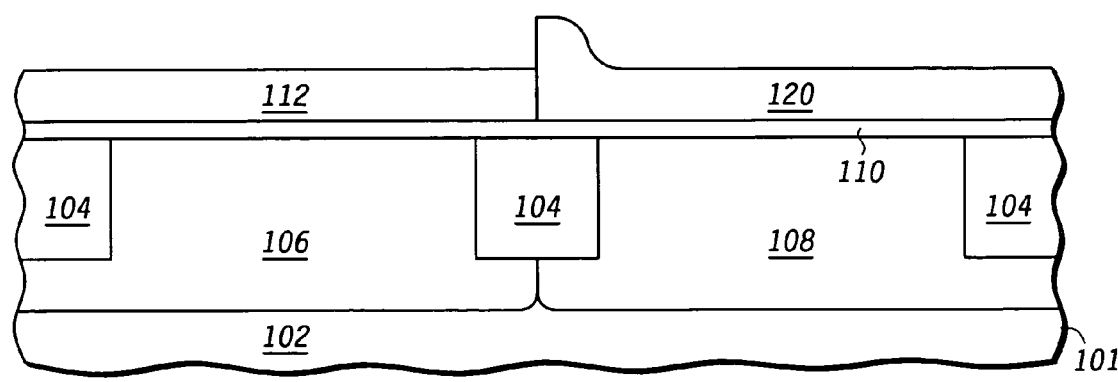
FIG. 9 depicts processing subsequent to FIG. 8 in which exposed portions of the second gate electrode layer are etched and the resist masked is stripped.
Figure 10:
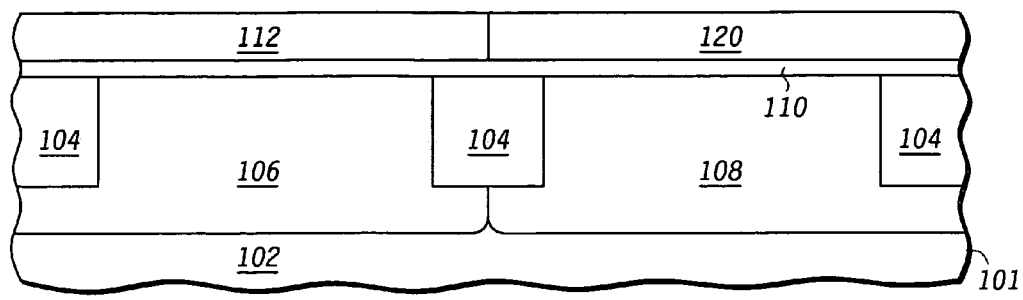
FIG. 10 depicts processing subsequent to FIG. 9 in which a chemical mechanical polish is performed to produce a planarized upper surface of the first and second electrodes.

Referring now to FIG. 8 through FIG. 10, a second embodiment of achieving equal height gate electrodes in a dual metal gate semiconductor fabrication process is depicted. This second embodiment illustrates processing that occurs subsequent to the processing described above with respect to FIG. 4 and is performed instead of the processing depicted in FIG. 5 above. Referring to FIG. 8, a photoresist mask 210 is formed to mask the portion of second gate electrode layer 120 overlying second region 108. As shown in FIG. 8, the photomask 210 is a "fully aligned" mask in the sense that it masks the entirety of the second gate electrode layer 120 overlying second region 108. Because fully aligned photomask 210 terminates over the isolation dielectric structures 104, it masks the entire second region 108. (The fully aligned mask 210 of FIG. 8 will be contrasted with an underlapping mask described below with respect to FIG. 1). Alternatively, the photomask 210 may be oversized enough to ensure that the photomask 210 masks the entire second region 108 even when inaccuracies in mask placement occur.

Referring to FIG. 9, the unmasked portions of second gate electrode layer 120 are etched away and the resist mask 210 stripped. In the depicted embodiment, the unmasked portions of second gate electrode layer 120 are the portions overlying first region 106. As seen in FIG. 9, the etch process, coupled with the alignment of mask 210, result in a non-planar post-etch upper surface. Specifically, a transitional portion of second gate electrode layer 120 (i.e., the portion of second gate electrode layer that rises up at the edge of first gate electrode layer 112) forms a peak that rises above the plane defined by the upper surface of second gate electrode layer 120 between adjacent isolation dielectric structures 104. Even though this non-planar peak overlies an isolation dielectric structure 104, it is preferable to planarize or remove the non-planarity before proceeding with subsequent processing.

Referring to FIG. 10, the non-planar peak depicted in FIG. 9 is removed with a conventional chemical mechanical polish process. As in FIG. 5 described above, FIG. 10 depicts wafer 101 as having a substantially planar upper surface that includes two metal gate materials (e.g., TiN and TaSiN). Following the processing depicted in FIG. 10, subsequent processing may proceed as depicted and described above with respect to FIG. 6 and FIG. 7 (i.e., the third gate electrode layer is deposited and a gate etch is performed). While this second embodiment of the processing does require an additional masking step, it can potentially reduce the amount of planarization required by the CMP process thereby potentially resulting in greater control over the final thickness of gate electrode layers 112 and 120.

Figure 11:
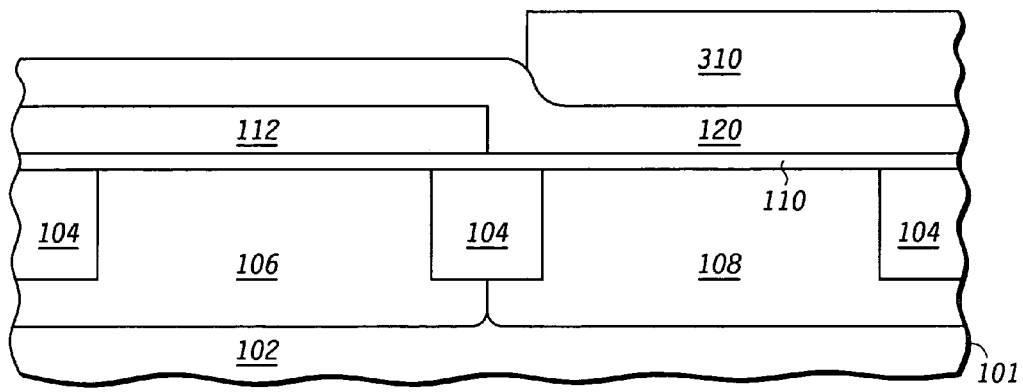
FIG. 11 depicts processing subsequent to FIG. 4 according to a third embodiment in which an "underlapping" photoresist mask is patterned over portions of the second gate electrode layer.
Figure 12:
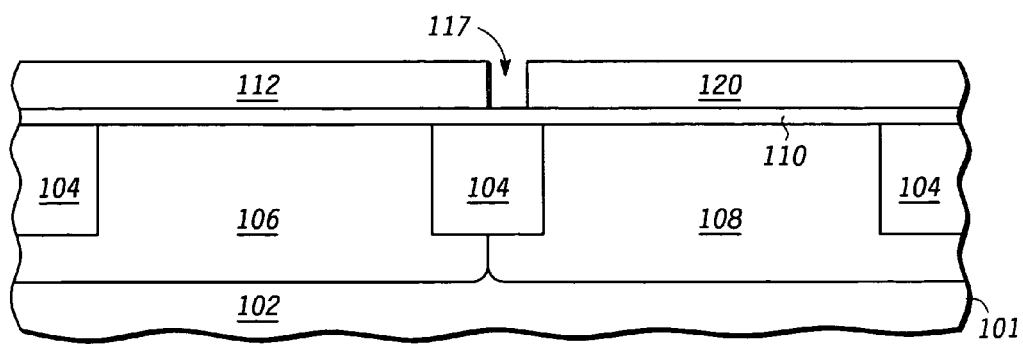
FIG. 12 depicts processing subsequent to FIG. 11 in which exposed portions of the second gate electrode layer are etched.
Figure 13:
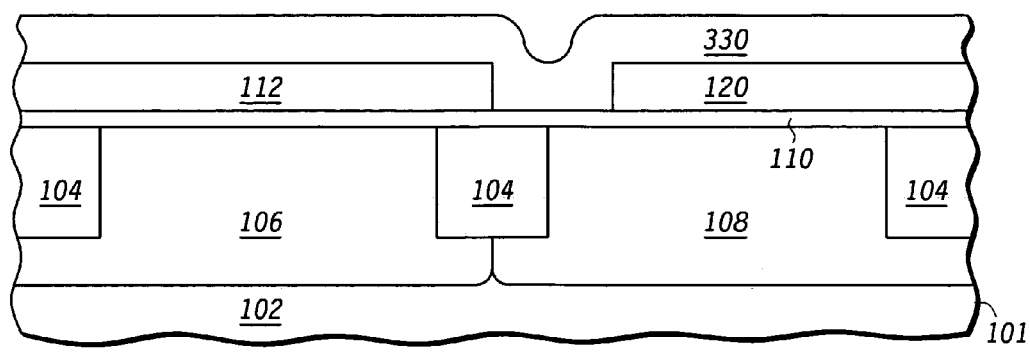
FIG. 13 depicts processing subsequent to FIG. 12 in which a third gate electrode layer is deposited over the first and second gate electrode layers.

Turning now to FIG. 11 through FIG. 13, a third embodiment of achieving like-height gate electrodes is depicted. In this embodiment, an underlapping photoresist mask 310 is patterned to mask a portion of the underlying second gate electrode layer 120. Photoresist mask 310 is referred to as an underlapping mask because it does not extend to or overlap the edge of first gate electrode layer 112.

Referring to FIG. 12, an etch has been performed to remove exposed portions of second gate electrode layer 120. In addition, underlapping photoresist mask 310 of FIG. 11 has been removed following the etch. Due to the underlapping photoresist mask 310 used in FIG. 11, the remaining portion of second gate electrode layer 120 does not extend to or overlap first gate electrode 112. Instead, a gap 117 exists between first and second gate electrode layers 112 and 120. By forming gap 117 between first gate electrode layer 112 and second gate electrode layer 120, the depicted processing sequence eliminates the non-planar peak (see FIG. 9) that occurred when second gate electrode layer 120 overlapped second gate electrode layer 112. Eliminating this peak beneficially eliminates the need for a polishing process to remove the peak.

Figure 14:
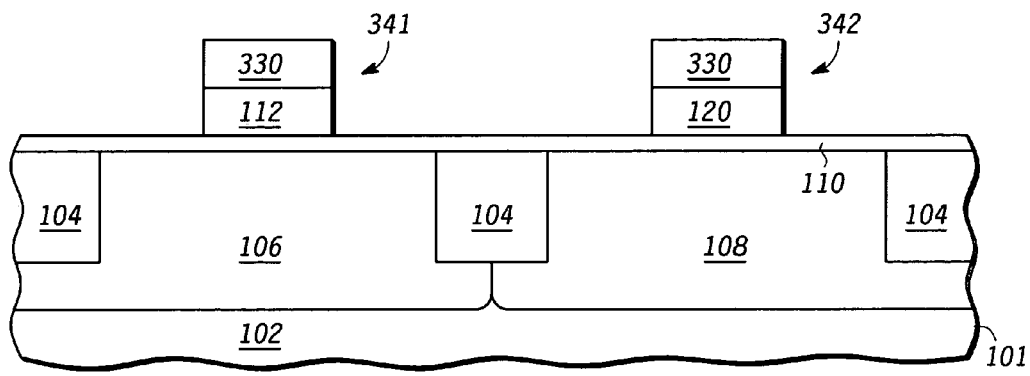
FIG. 14 depicts processing subsequent to FIG. 13 in which gate etch processing is performed; and Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

In FIG. 13, a third gate electrode layer (e.g., polysilicon) 330 is shown after a conformal deposition. Because second gate electrode layer 120 did not extend all the way to first gate electrode layer 112, a portion of third gate electrode layer 330 contacts isolation dielectric structure 104 directly. However, following the subsequent gate etch processing, as shown in FIG. 14, the portion of third gate electrode layer 330 that directly contacts isolation dielectric structure 104 is removed and the resulting gate electrodes 341 and 342 are substantially equivalent to the electrodes 141 and 142 depicted in FIG. 7.

In the foregoing specification, the invention has been described with reference to specific embodiments. However, one of ordinary skill in the art appreciates that various modifications and changes can be made without departing from the scope of the present invention as set forth in the claims below. For example, while hard mask 114 is described as a TEOS hard mask, it may also be implemented using silicon nitride or another suitable material. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of forming gate electrodes in a semiconductor fabrication process, comprising:

forming a gate dielectric overlying a semiconductor substrate;

depositing a first gate electrode layer overlying the gate dielectric;

removing portions of the first gate electrode layer thereby exposing portions of the gate dielectric;

depositing a second gate electrode layer overlying the first gate electrode layer and exposed portions of the gate dielectric; and removing the second gate electrode layer where it overlies the first gate electrode layer wherein remaining portions of the first and second gate electrode layers have substantially the same thickness, wherein a majority of the first gate electrode layer overlies a first well region of the substrate and wherein a majority of the second gate electrode layer overlies a second well region of the substrate, and wherein the first well region is an NWELL region and the first gate electrode layer is TiN and wherein the second well region is an PWELL region and the second gate electrode layer comprises TaSiN, TaC, or $Ta_xC_yN_z$.

2. The method of claim 1, further comprising depositing a third gate electrode layer overlying the first and second gate electrode layers.

3. The method of claim 1, wherein the gate dielectric is selected from the group consisting of $SiO_2$, $Si_3N_4$, and SiON.

4. The method of claim 1, wherein removing the second gate electrode layer comprises performing a chemical mechanical polish (CMP) process without masking the second gate electrode layer.

5. The method in claim 1, further comprising, prior to said removing of portions of the first gate electrode layer, patterning a hard mask overlying portions of the first gate electrode layer.

6. A semiconductor fabrication process, comprising:

depositing a first gate electrode layer overlying a gate dielectric;

patterning the first gate electrode layer;

depositing a second gate electrode layer overlying the patterned first gate electrode layer and the gate dielectric;

removing the second gate electrode layer where it overlies the patterned first gate electrode wherein a thickness of remaining portions of the second gate electrode layer is substantially equal to a thickness of the patterned first gate electrode layer, wherein a majority of the first gate electrode layer overlies a first well region of the substrate and wherein a majority of the second gate electrode layer overlies a second well region of the substrate, and wherein the first well region is an NWELL region and the first gate electrode layer is TiN and wherein the second well region is an PWELL region and the second gate electrode layer comprises TaSiN, TaC, or $Ta_xC_yN_z$;

depositing polycrystalline silicon (polysilicon) overlying the first and second gate electrode layers; and selectively etching portions of the polysilicon and the underlying first and second gate electrode layers to form first and second gate electrodes.

7. The method of claim 6, wherein removing the second gate electrode comprises performing a (chemical mechanical polish) process following depositing the second gate electrode layer.

* * * * *